United States Patent [19]
Williams et al.

[11] Patent Number: 5,250,902
[45] Date of Patent: Oct. 5, 1993

[54] REDUCTION OF GRADIENT COIL INTERACTION WITH ROOM TEMPERATURE SHIMS

[75] Inventors: Evan H. Williams, Menlo Park; Norbert Schuff, San Francisco, both of Calif.

[73] Assignee: Varian Associates, Inc., Palo Alto, Calif.

[21] Appl. No.: 811,442

[22] Filed: Dec. 19, 1991

[51] Int. Cl.$^5$ .............................................. G01R 33/20
[52] U.S. Cl. ...................................... 324/320; 324/318
[58] Field of Search ................. 324/318, 320, 322; 128/653.5; 335/296, 299

[56] References Cited

U.S. PATENT DOCUMENTS

| | | | |
|---|---|---|---|
| 4,607,225 | 8/1986 | Crooks | 324/318 |
| 4,683,434 | 7/1987 | Tschopp | 324/320 |
| 4,700,136 | 10/1987 | Yamaguchi et al. | 324/320 |
| 4,906,934 | 3/1990 | Haragashira | 324/322 |

Primary Examiner—Michael J. Tokar
Assistant Examiner—Raymond Y. Mah
Attorney, Agent, or Firm—Edward H. Berkowitz

[57] ABSTRACT

A gated amplifier drives a gradient coil when the gate signal is applied and the gate signal also controls an FET switch to disconnect a shim power supply from shim coils and connects the shim power supply instead to a dummy load. When the gate signal is removed, the shim coil is restored to operation from the shim power supply.

2 Claims, 5 Drawing Sheets

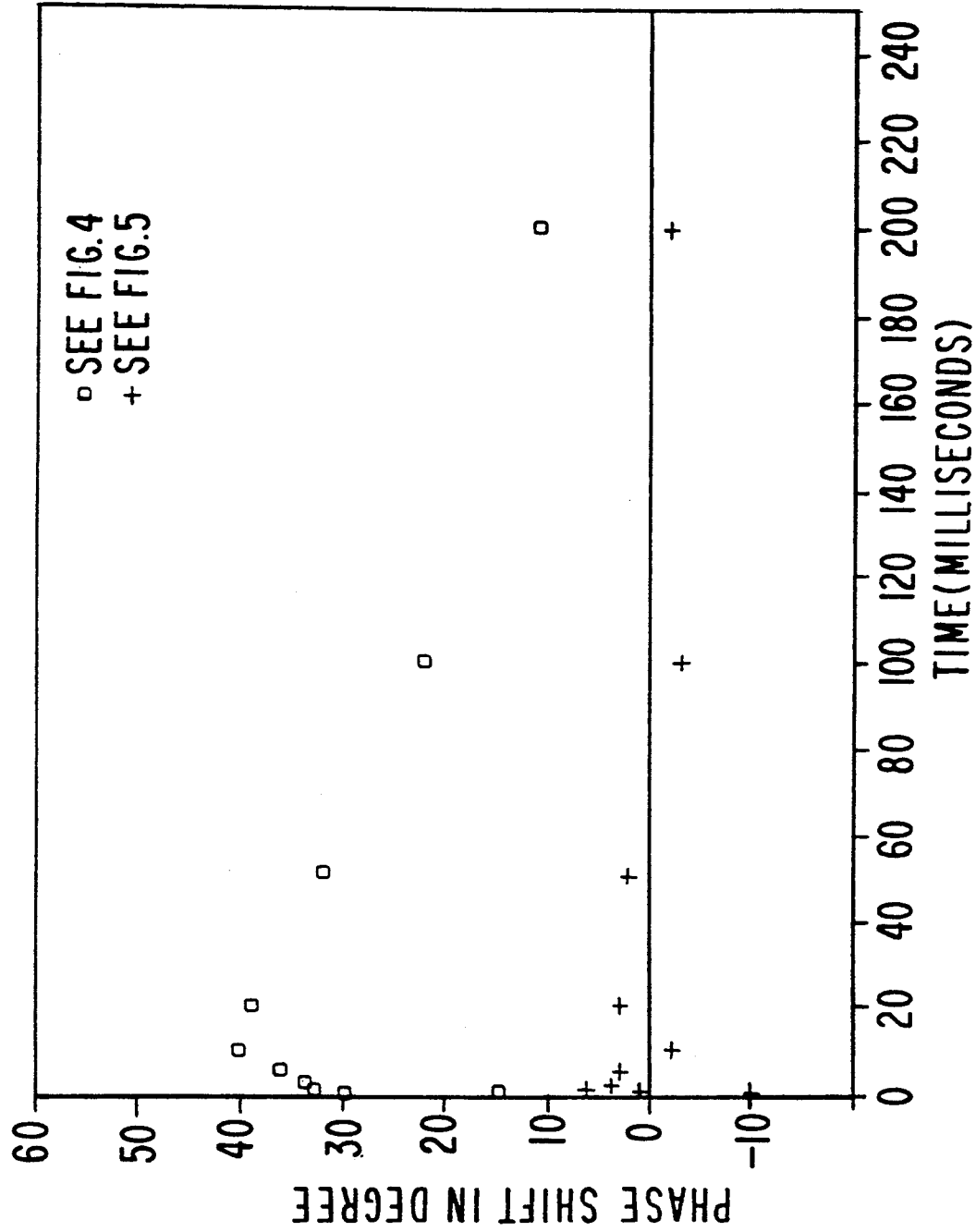

REDUCTION OF GRADIENT COIL INTERACTION WITH ROOM TEMPERATURE SHIMS

FIELD OF THE INVENTION

The invention is in the area of nuclear magnetic resonance instruments generally and particularly pertains to apparatus including transient gradient magnetic field coils and static magnetic field compensatory coils.

BACKGROUND OF THE INVENTION

The NMR phenomena is a magnetic field sensitive response of nuclear magnetic moments (or "spins") to transfer of energy from an external energy source to the nuclear spin system. The phenomena is applied in many different forms, but largely the underlying physical operation may be regarded as a measurement of magnetic field in term of an RF frequency. Broadly speaking, the phenomena is exploited for applications in the field of analytical chemistry and separately for acquiring representations of spatial distributions of compositions exhibiting certain chemical characteristics. An example of the latter is apparatus for realizing an image of a sample. These are not exclusive purposes: spatial distribution maps, e.g., medical imaging, also include aspects of analytic chemical discriminator, and applications in analytic chemistry may utilize spatial discrimination. The phenomena demands a locally defined magnetic environment whether such magnetic environment includes a known field which is static and uniform or transient and non-uniform.

In order to assure control of the magnetic environment, the sample space is carefully shimmed, that is to say, compensated, to reduce undesired magnetic field components. This is accomplished with static shim coils designed to controllably impost a magnetic field of selected direction and/or symmetry to cancel a residual magnetic field in the sensitive volume of the instrument. These shim coils are often disposed in the room temperature peripheral space of the bore of a superconducting magnet.

The achievement of a high degree of uniformity is essential for the magnetic environment of a sample to be studied via NMR phenomena. Controlled non-uniformity of the same magnetic environment is required for a number of measurement techniques. These techniques demand precise control in spatial dependence. Transient gradient fields add further requirements for both spatial and time dependence of the desired magnetic field. Examples of such apparatus are in the spatial encoding of information in NMR signals; selective excitation and/or detection of specific quantum transitions; and, observation or exploitation of various diffusion related phenomena.

Desired magnetic field gradients are obtained with coils designed to furnish the required directional and spatial dependence in cooperation with respective current sources controllable to yield the desired amplitude, duration and perhaps functional time dependence. These coils are disposed at the periphery of the bore of the superconducting magnetic in close proximity to the shim coils. As a consequence of the close proximity of (pulsed) gradient coils and (steady state) shim coils, there is induced in (certain) shim coils a current component due to application of the transient condition to the gradient coil. This parasitic effect maximal for shim coils or gradient coils which generate roughly parallel (or anti-parallel) field components and minimal in the case where the mutual orientation of fields produced by the shim coil and the gradient coil are orthogonal.

The problem is exacerbated in narrow bore instruments because the shim and gradient coils are necessarily disposed quite close together. In very wide bore equipment, such as medical imagers, there if frequently no provision for shim coils, or the available space permits some displacement of shim coils and gradients coils or provision is made for shielding means between them to attenuate the coupling therebetween.

It is known to employ a corresponding gradient amplifier-gradient coil combination to furnish the shim field component during a transient, leaving the shim coil disconnected from its power supply and directing the shim power supply output to the gradient amplifier. A typical gradient amplifier is rated to deliver of the order of $10^2$ amps for the transient gradient excitation. The shim field components consumes of the order of $10^{-3}$ amps in the steady state. The steady state performance at the lower output current level is affected by amplifier noise. This is qualified by the observation that shimming via gradient coils as above described may secure homogeneity of the order of 2 to 5 Hertz (as measured by the observed width of a sharp resonant line) whereas the shimming operation via static shim coils may yield an observed line width of the order of 0.2 to 0.5 Hertz.

The nature of the invention between these (undesirably) coupled coils may be quite complex because the respective circuits ordinarily exhibit diverse time constant and in general one observes damped oscillations ("ringing") in the response of the shim coil.

BRIEF SUMMARY OF THE INVENTION

During a gradient pulse, the present invention synchronously directs the pulsed energy through a gated amplifier to a gradient coil with concurrent disconnection of a room temperature shim coil. The output of the shim coil power supply is directed to a dummy load for the duration of the gradient pulse until the gradient amplifier is gated off. The room temperature shim is then switched back to its power supply and the gradient amplifier in its "off" gated condition contributes no noise to the gradient coil affecting the steady state shim condition.

BRIEF DESCRIPTION OF THE FIGURES

FIG. 6 shows the time variation of the field (signal phase) for the data of FIGS. 4 and 5.

DETAILED DESCRIPTION OF THE INVENTION

Figure 1:
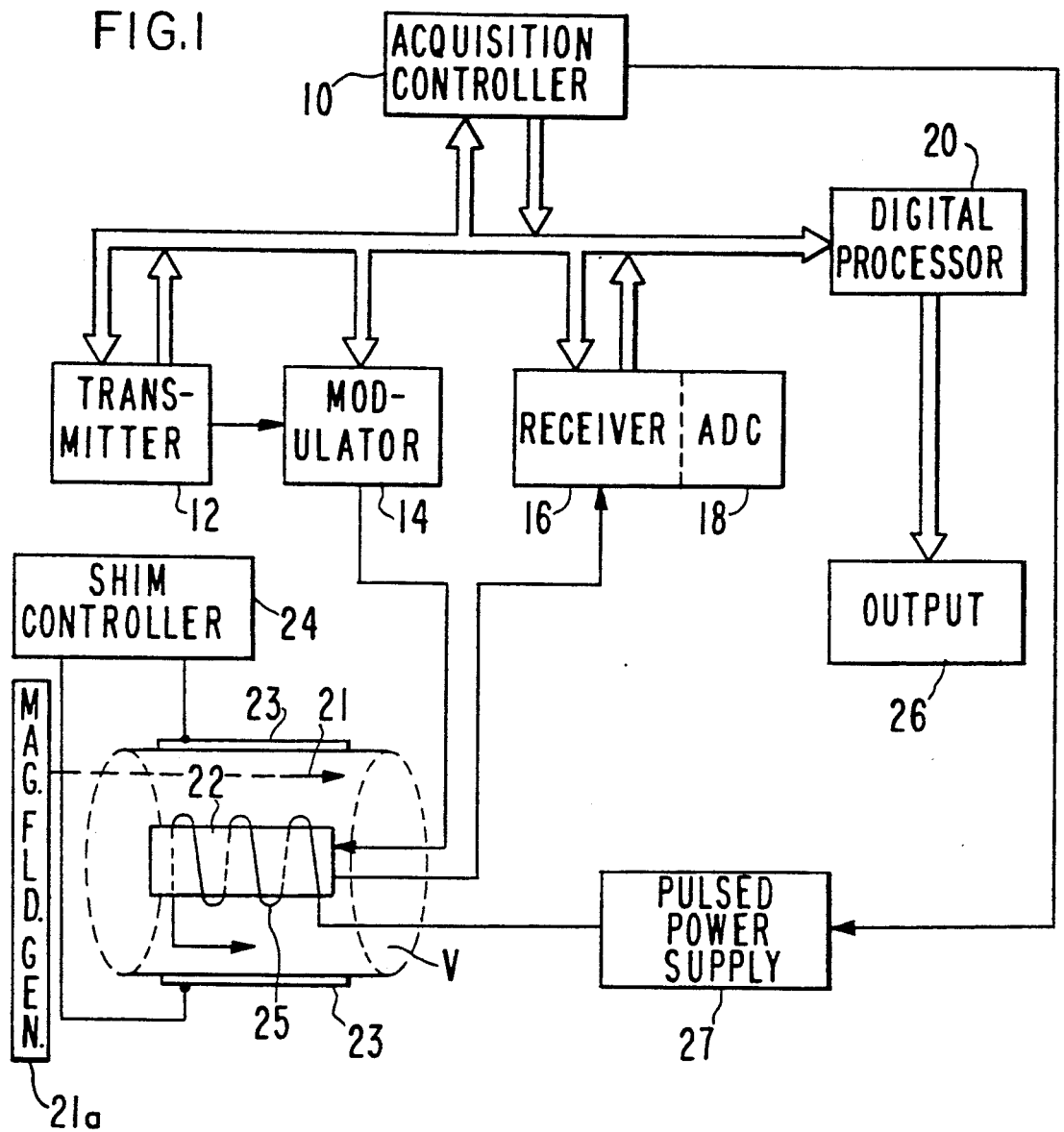
FIG. 1 is a schematic description of the context of this invention.

A typical NMR data acquisition instrument is schematically illustrated on FIG. 1. An acquisition/control processor 10 communicates with an RF transmitter 12, modulator 14 and receiver 16 including analog-to-digital converter 18 and digital processor 20. A modulated RF power source irradiates an object (not shown) and magnetic field 21 is maintained to define a region of magnetic field homogeneity, or sensitive volume region. Shim coils 23 are disposed to compensate measured departures from homogeneity in the sensitive volume under control of shim controller unit 24. Gradient coils 25 excited by pulsed power supply 27 are disposed to impose known and controlled field gradients on the sensitive region. A probe assembly 22 is disposed in the sensitive volume region. Resonant response of the object is intercepted by probe 22 communicating with receiver 16. The response typically takes the form of a transient oscillatory signal, or free induction decay. This transient waveform is sampled at regular intervals and the samples are digitized in adc 18. The digitized time domain waveform is then subject to further processing in processor 20. The nature of such processing may include averaging the time domain waveform with a number of nominally identical such waveforms, and transformation of the averaged time domain waveform to the frequency domain to yield a spectral distribution function which is directed to output device 26. The latter may take on any of a number of identities with the display of further analysis and data.

The magnetic field 21 is established by an appropriate magnet means 21a maintained in a cryostat housing a superconducting solenoid for establishing a magnetic field in a bore of the cryostat, (not shown). The probe, sample, gradient coils and (at least some of the) shims are housed at room temperature in the bore of the cryostat structure. Their structures are well known.

Figure 2A:
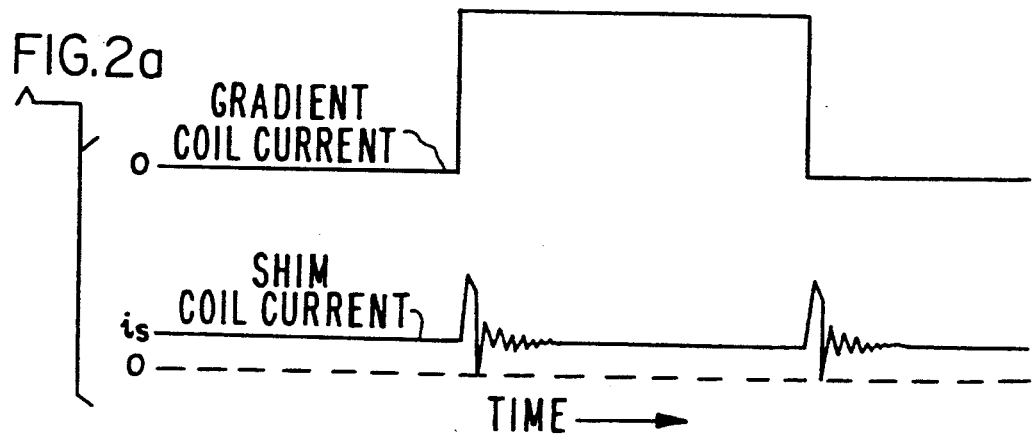
FIG. 2A describes the deleterious effect.

It is recognized in the present work that pulsed gradient fields induce eddy currents in certain nearby closed circuits such as the shim coils, and these circuits are amenable to control. Thus, in FIG. 2a one would measure a transient in the shim current $i_s$ consequent to gradient transients. The resulting magnetic environment would reflect a superposition of these effects, thereby exposing the sample to a transient magnetic field component due to eddy currents sustained in the shim coil circuits.

Figure 2B:
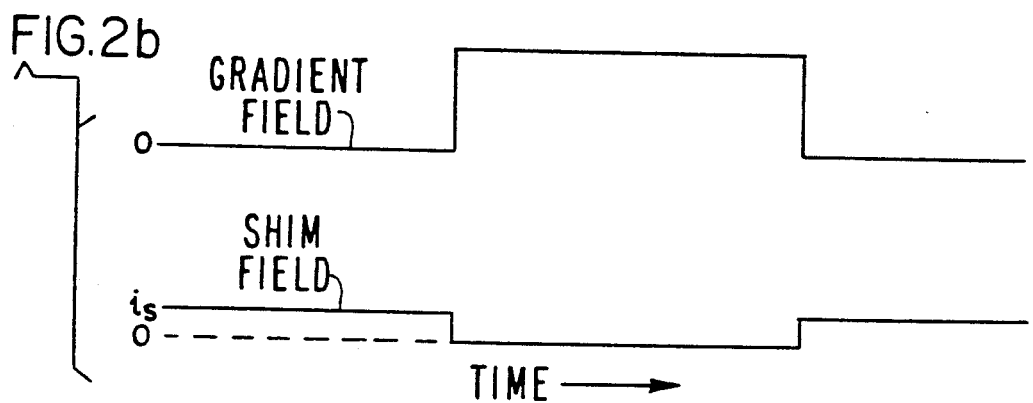
FIG. 2B describes an amelioration of the effect of FIG. 2A.

In FIG. 2b there is expressed an arrangement wherein the shim coil circuit is interrupted for the interval wherein the gradient is active, thereby avoiding the above undesirable effect.

Figure 3:
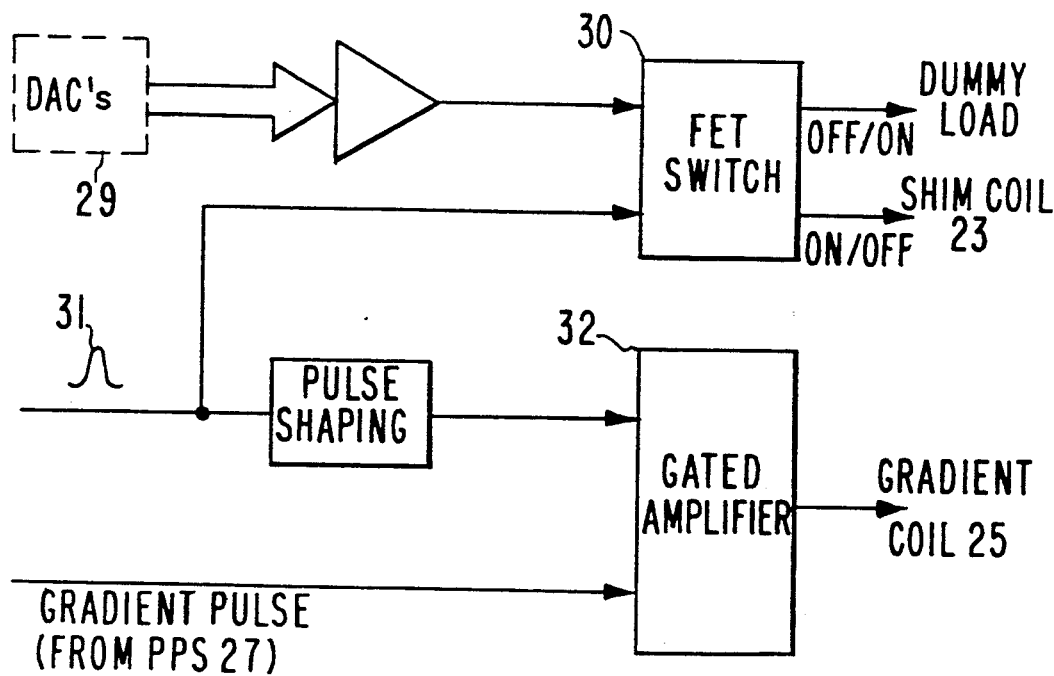
FIG. 3 is a block diagram of the switching arrangement of the present invention.

Turning now to FIG. 3, there is shown a circuit suitable to effectuate the present invention. The proper shim current for the shim coil 23 is established by the shim controller and power supply means 24. The adjustment of the shim current is beyond the scope of the present work but is an otherwise known technique. The value of the shim current is adjusted to establish a compensating field that cancels a remnant undesired field component thereby to establish a more uniform magnetic field within the sensitive region V, occupied by the sample. This is important because any applied gradient, as well as the static field will be distorted by undesired inhomogeneity. The proper current is controlled, usually, from digital to analog converters (DACs) 29 comprising current sources from which a current is directed through FET switch 30. Switch 30 has the character of a single pole-double throw configuration controlled by gate pulse 31. Gate pulse 31 is also shaped to operate the gate input of gated amplifier 32. The linear input of the gated amplifier 32 is derived from a pulse programmer, not shown but forming a portion of acquisition controller 10, to produce the desired gradient pulse of specified amplitude and time dependence. The gated amplifier 32 is preferably operated in the Class A mode and when gated on presents a desired excitation to the corresponding gradient coil.

When the gate pulse 31 occurs, the FET switch 30 switches the shim power supply to the dummy load leaving the shim coil open and thus incapable of supporting induced currents.

It is to be noted that during the interval when the gradient pulse excites the gradient coil, the compensatory field is now absent. In ordinary arrangements the gradient pulse presents a time dependent magnetic field which is very much greater than (typically, 2 orders of magnitude) the field supplied by the shim coil. It is also to be recalled that shim coils and gradient coils generating approximately parallel (or antiparallel) directed magnetic fields are subject to the greatest interaction. In the instance where these fields are in fact parallel (or anti-parallel) the effect of the compensatory field is completely subsumed within the transient field.

Figure 4:
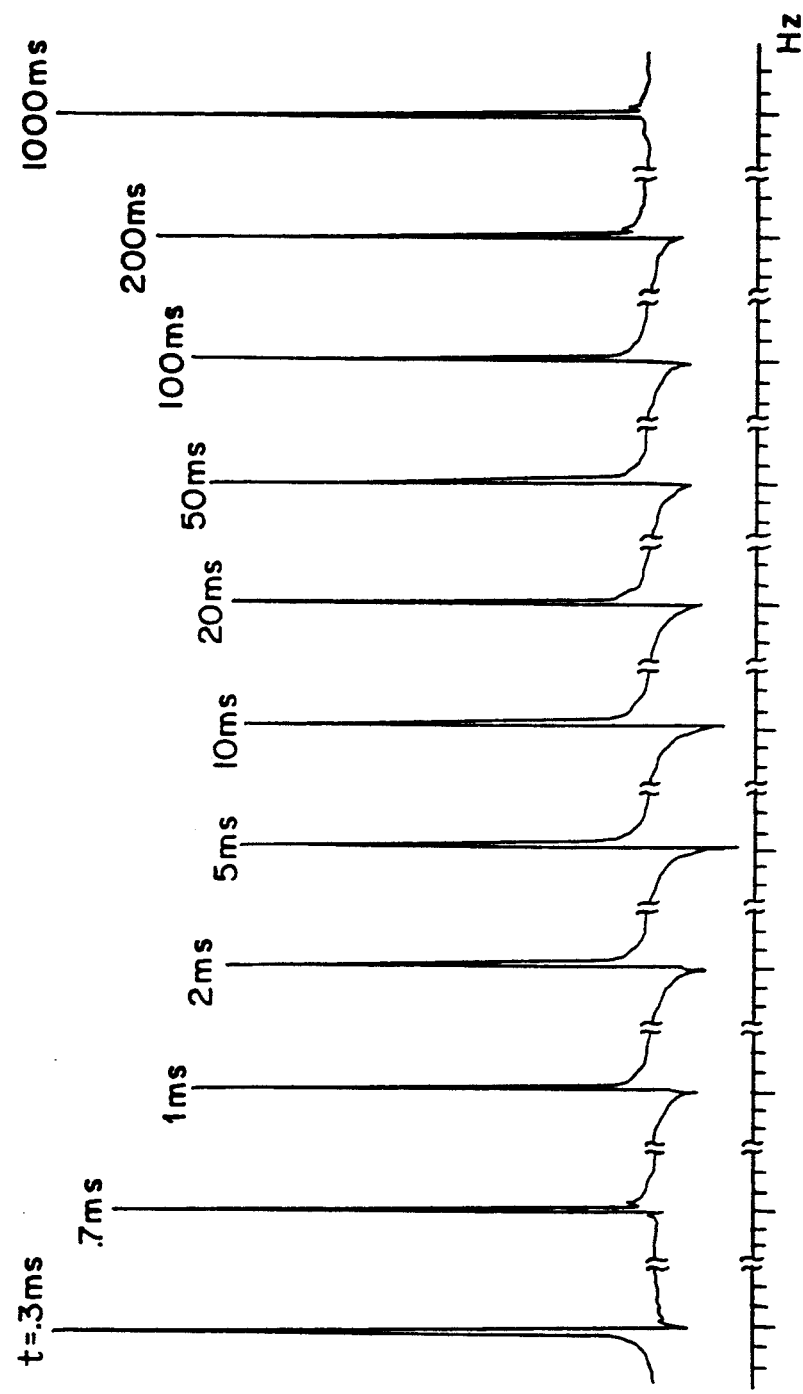
FIG. 4 shows a set of line shapes acquired at successive times as perturbed by magnetic field transients induced in shim coils.

FIG. 4 shows a set of 11 line shapes for a water sample acquired for 11 values of elapsed time (0.3 millisecond to 1 sec.) from the removal of the gradient field to the acquisition of the respective line shape. During this time any transient magnetic field components due to eddy currents will be active. As the elapsed time is incremented, the phase of the resonance line shifts demonstrating the presence of a transient magnetic field. The line shape and its phase conveys a measure of the instantaneous magnetic field condition. The set of line shapes of FIG. 5 were acquired in the arrangement where the shim coils will remain connected to the shim power supply thereby supporting eddy currents in the shim coils due to transitions of the gradient field. The line shapes acquired at different times exhibit variation in phase, indicating a transient magnetic field component (over a range of about 200 millisecond) due to eddy currents during this interval. This variation is shown expressly in FIG. 6 for the data of FIG. 4 (open square) and the data of FIG. 5 ("+").

Figure 5:
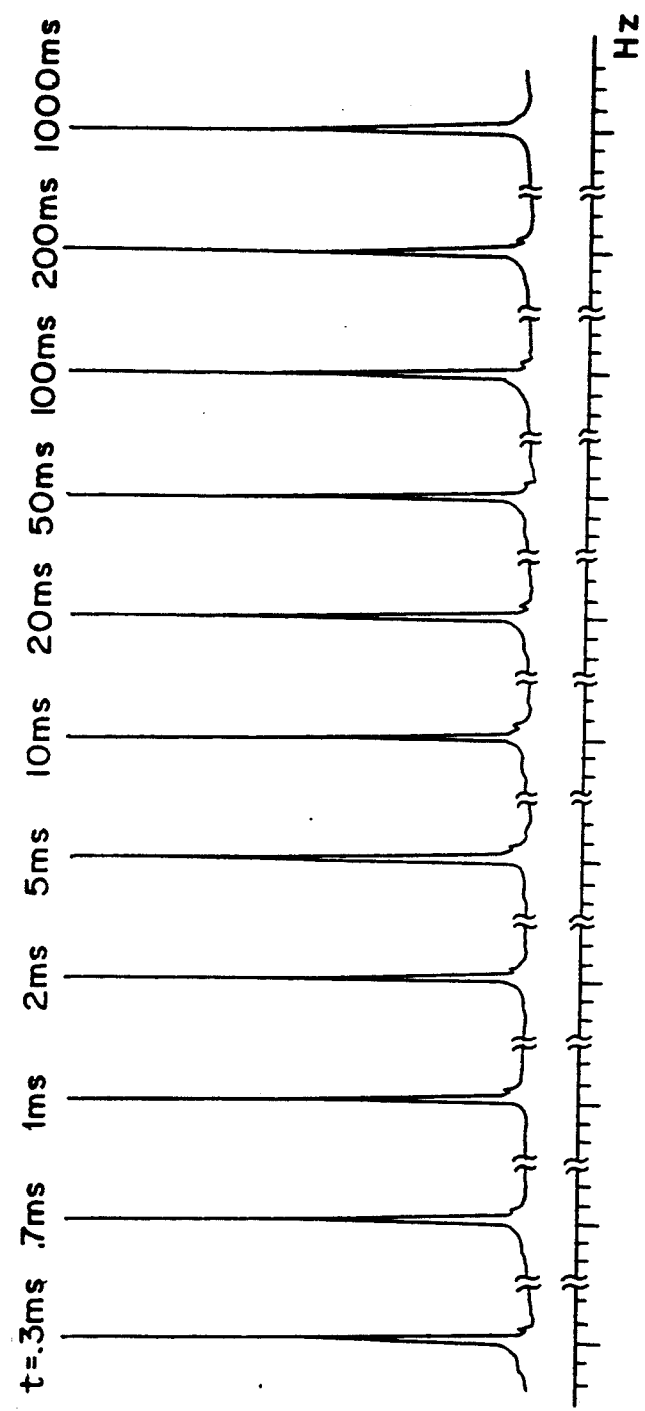
FIG. 5 shows result of the present invention for measurements of FIG. 4.

FIG. 5 is acquired following the teaching of the present invention wherein the shim coils are disconnected to eliminate a transient magnetic field arising from eddy currents in the shim coils. A very small transient component is observed for the earliest of the line shapes (at $t=0.3$ ms) due to eddy currents induced in other conductive structures.

The above described measurements were carried out in an actively shielded gradient environment to remove the effect of eddy currents induced in the cryostat structure, e.g., physical structure disposed at greater radial distance than the shim coil 23 from the axis.

The invention as here described is effective for a wide range of usages of pulsed gradient fields. However, in the general case, RF excitation concurrent with pulsed gradient activation, e.g., slice selection, will require additional correction.

As the invention may be embodied in several forms without departing from the spirit of the essential characteristics thereof, the present embodiment is illustrative and not restrictive, since the scope of the invention is defined by the dependent claims rather than by the description preceding them and all changes which fall within the scope of the claims of equivalence of such claims are therefore intended to be embraced by the claims following.

What is claimed is:

1. Apparatus for magnetic resonance measurement comprising:
   (a) Main polarizing magnet means for establishing an axis of precession for nuclear spins; and,
   (b) At least one magnet shimming means for compensating an undesired magnetic field component, said magnet shimming means comprising:
      (1) a shim coil and,
      (2) a shim power supply communicating with said shim coil for supplying current to said shim coil,
   (c) Pulsed gradient field means for imposing a transient magnetic gradient on a sample space, comprising:
      (1) pulse gradient power supply further comprising a gated amplifier; and,
      (2) gradient coils means, communicating with said pulse gradient power supply,
   (d) Switch means for disabling said communication of said shim power supply to said shim coil and establishing communication of said shim power supply to a dummy load; and,
   (e) Gate signal means for actuating said switch means and for concurrently enabling said gated amplifier to activate said gradient coil, whereby said shim coil is an open circuit when said transient gradient coil is activated.

2. The method of avoiding interaction of shim coils with gradient coils of NMR apparatus comprising the steps of:
   (a) providing a gating signal to a gated amplifier,
   (b) driving a gradient coil from the output of said gated amplifier as a result of step (a),
   (c) deriving from said gating signal a switch control level,
   (d) actuating a switch in response to said switch control level to disconnect said shim coil from a shim coil energy source and connecting said shim coil energy source to a dummy load,
   (e) removing said gating signal from said gated amplifier and returning said switch to a second state including disconnecting said shim coil energy source from said dummy load and connecting said shim coil.

* * * * *